(12) United States Patent
Lai et al.

(10) Patent No.: US 6,659,795 B1
(45) Date of Patent: Dec. 9, 2003

(54) ELECTRICAL CONNECTOR WITH RETENTION POSTS

(75) Inventors: Ching-Ho Lai, Tu-chen (TW); Fang-Jwu Laio, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/407,325

(22) Filed: Apr. 3, 2003

(30) Foreign Application Priority Data

Nov. 8, 2002 (TW) ...................................... 91217914 U

(51) Int. Cl.⁷ ................................................. H01R 9/09
(52) U.S. Cl. ...................................... 439/526; 439/680
(58) Field of Search ............................... 439/526, 674, 439/677, 680

(56) References Cited

U.S. PATENT DOCUMENTS

| | | | |
|---|---|---|---|
| 5,192,213 A | | 3/1993 | Kosugi et al. |
| 5,199,889 A | | 4/1993 | McDevitt, Jr. |
| 5,232,372 A | | 8/1993 | Bradley et al. |
| 5,320,559 A | | 6/1994 | Uratsuji et al. |
| 5,362,241 A | | 11/1994 | Matsuoka et al. |
| 5,466,171 A | * | 11/1995 | Bixler et al. ................. 439/680 |
| 5,637,019 A | * | 6/1997 | Crane et al. ................. 439/677 |
| 5,833,472 A | * | 11/1998 | Bright ......................... 439/680 |
| 5,839,918 A | * | 11/1998 | Matsuoka .................... 439/526 |

FOREIGN PATENT DOCUMENTS

| EP | 0 443 492 A1 | * | 8/1991 | ................. 439/680 |
|---|---|---|---|---|

* cited by examiner

*Primary Examiner*—Tho D. Ta
(74) *Attorney, Agent, or Firm*—Wei Te Chung

(57) ABSTRACT

An electrical connector (2) for connecting a land grid array (LGA) chip (3) with a printed circuit board includes a housing (20) and terminals (21) received in the housing. Two cylindrical posts (201, 202) extend upwardly from diagonally opposite corners of the housing. Two recesses (301, 302) are defined in diagonally opposite corners of the LGA chip. The LGA chip is inserted into the LGA connector, with the recesses interferentially receiving the posts. Thus the LGA chip is securely mounted on the housing, with the posts and the recesses cooperating to precisely position the LGA chip on the LGA connector. This ensures that engagement between contact pads (300) of the LGA chip and the terminals is highly accurate and reliable. Further, the posts are sized differently from each other, and the recesses are correspondingly sized differently from each other. Mismating of the LGA chip with the LGA connector is prevented.

4 Claims, 5 Drawing Sheets

ELECTRICAL CONNECTOR WITH RETENTION POSTS

BACKGROUND OF THE INVENTION

1. Field of the Invention

The present invention relates to an electrical connector for electrically connecting an electronic package such as a land grid array (LGA) chip with a circuit substrate such as a printed circuit board (PCB), and particularly to a connector having retention posts that securely position the electronic package therein.

2. Description of the Prior Art

Land grid array (LGA) electrical connectors are widely used in the connector industry for electrically connecting LGA chips to printed circuit boards (PCBs) in personal computers (PCs). As described in "Nonlinear Analysis Helps Design LGA Connectors" (Connector Specifier, February 2001, pp. 18–20), the LGA connector mainly comprises an insulative housing and a multiplicity of electrical terminals. The housing comprises a multiplicity of terminal passageways defined therein in a generally rectangular array for interferentially receiving corresponding terminals. Due to the very high density of a terminal array that an LGA chip may have, the LGA chip needs to be precisely seated onto the LGA connector to ensure reliable signal transmission between the terminals and the LGA chip. Means for accurately attaching the LGA chip to the LGA connector are disclosed in U.S. Pat. Nos. 5,192,213, 5,199,889, 5,232,372, 5,320,559 and 5,362,241.

Referring to FIG. 5, a conventional LGA connector 6 comprises an insulative housing 60, a multiplicity of terminals 61 received in the housing 60, and a load plate 62 and a cam lever 63 pivotably mounted on two opposite ends of the housing 60. The load plate 62 defines a channel 620 receiving the cam lever 63. To mount an LGA chip (not shown) on the LGA connector 6, the load plate 62 is rotated up until it is perpendicular to the housing 60. The LGA chip is seated in the housing 60, and is loosely engaged with the terminals 61. The load plate 62 is rotated down so that it rests on the LGA chip. The cam lever 63 is rotated down until it engages in the channel 620 of the load plate 62. When the cam lever 63 has reached the end of its travel, the load plate 62 presses the LGA chip into firm engagement with the terminals 61 of the connector 6.

In the above-described assembly process, the load plate 62 presses the LGA chip between two opposite sides of the housing 60 of the connector 6. Generally, a material of the housing 60 is not resilient, and the sides of the housing 60 cannot elastically deform under pressure from the LGA chip. If the LGA chip is wider than a distance between the opposite sides of the housing 60, the housing 60 is liable to break. On the other hand, if the LGA chip is narrower than the distance between the opposite sides of the housing 60, the LGA chip may be poorly positioned relative to the terminals 61. This can adversely affect mechanical and electrical connection between the LGA chip and the connector 6. Furthermore, when the load plate 62 presses the LGA chip to firmly engage with the terminals 61, the housing 60 is liable to break if asymmetrical force is inadvertently applied thereto.

FIG. 6 shows another conventional LGA connector 6' devised to circumvent the above-described problems. The connector 6' comprises an insulative housing 60', and a multiplicity of terminals 61' received therein. In forming the connector 6', a carrier strip (not shown) is used. The carrier strip comprises a row of the terminals 61', and a row of connecting sections (not shown) respectively connecting the terminals 61' with a main body of the carrier strip. The housing 60' comprises four raised sidewalls 62', and a flat base 63' disposed between the sidewalls 62'. The base 63' and the sidewalls 62' cooperatively define a space therebetween for receiving an LGA chip (not shown) therein. The base 63' defines a multiplicity of terminal passageways 64' for receiving the terminals 61' therein. When the LGA chip is seated on the LGA connector 6', the four sidewalls 62' can securely engage the LGA chip therebetween.

However, installation of terminals 61' into those passageways 64 near two of the sidewalls 62' is problematic. Once the terminals 61' have been inserted into such passageways 64', the connecting sections of the carrier strip must be cut from their corresponding terminals 61', Because the carrier strip is located close to the relevant sidewall 62', there is insufficient space to manipulate the carrier strip to allow easy cutting off of the connecting sections. Such manipulation is blocked by the sidewall 62, which is liable to sustain damage as a result.

Therefore, a new LGA electrical connector which overcomes the above-mentioned problems is desired.

SUMMARY OF THE INVENTION

An object of the present invention is to provide an electrical connector for electrically connecting an electronic package such as an LGA chip with a circuit substrate such as a PCB, whereby the electrical connector can facilitate secure positioning of the electronic package therein.

To achieve the above object, an LGA electrical connector for connecting a land grid array (LGA) chip with a printed circuit board (PCB) includes an insulative housing and a plurality of electrical terminals received in a plurality of passageways defined in the housing. Two cylindrical posts extend upwardly from two diagonally opposite corners of the housing respectively. Two recesses are defined in diagonally opposite corners of a bottom surface of the LGA chip respectively, corresponding to the posts. In assembly of the LGA connector with the LGA chip, the LGA chip is inserted into the LGA connector along a direction of assembly. The recesses interferentially receive the posts. Thus the LGA chip is securely mounted on the housing of the LGA connector. The posts of the LGA connector and the recesses of the LGA chip cooperate to precisely position the LGA chip on the LGA connector. This ensures that engagement between contact pads of the LGA chip and the terminals is highly accurate and reliable. In addition, the posts are sized differently from each other, and the recesses are correspondingly sized differently from each other. Accordingly, mismating of the LGA chip with the LGA connector is prevented.

Other objects, advantages and novel features of the invention will become more apparent from the following detailed description when taken in conjunction with the accompanying drawings, in which:

DESCRIPTION OF THE PREFERRED EMBODIMENT

Reference will now be made to the drawings to describe the present invention in detail.

Figure 1:
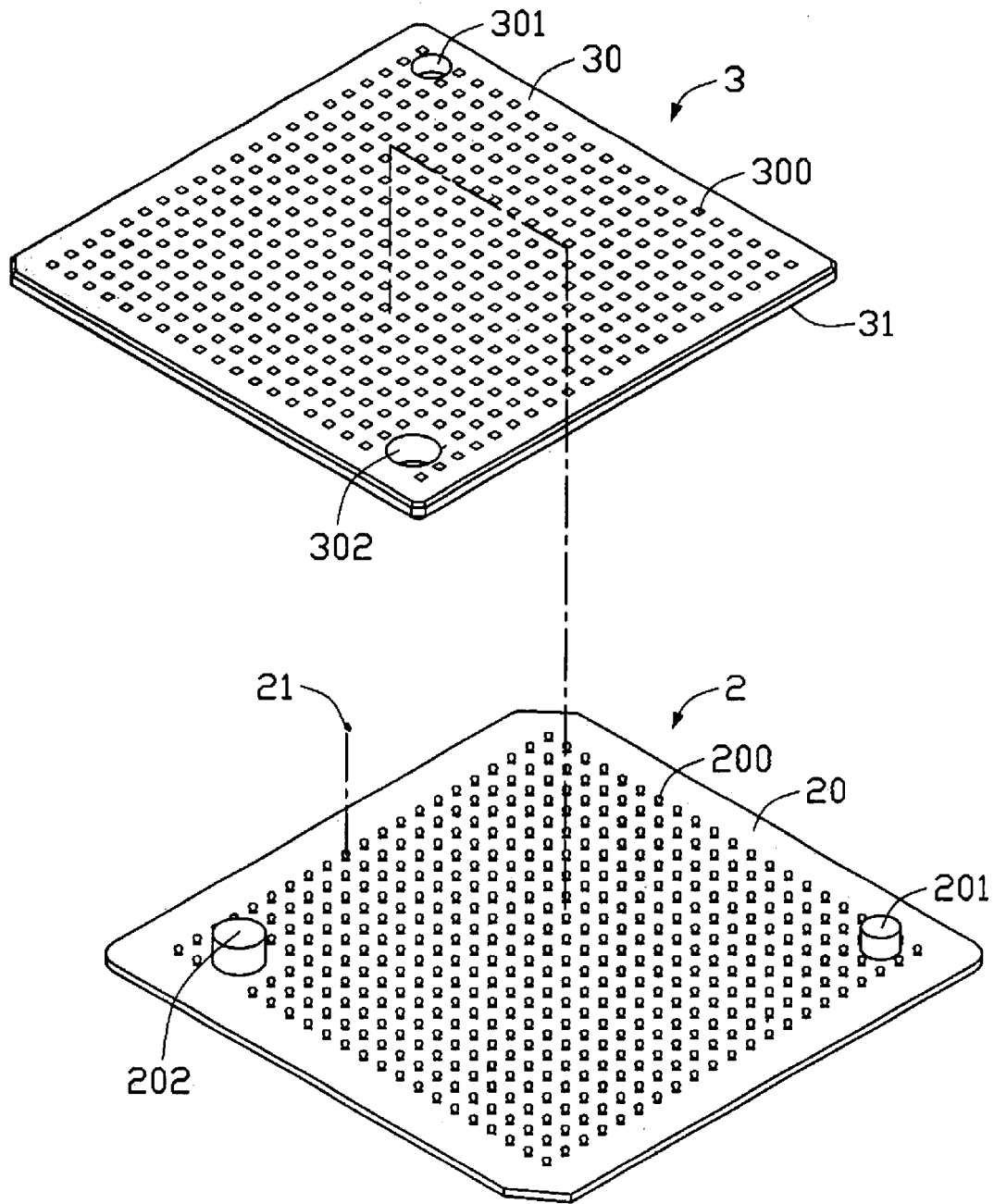
FIG. 1 is a simplified, exploded isometric view of an LGA electrical connector in accordance with a preferred embodiment of the present invention, together with an LGA chip.
Figure 2:
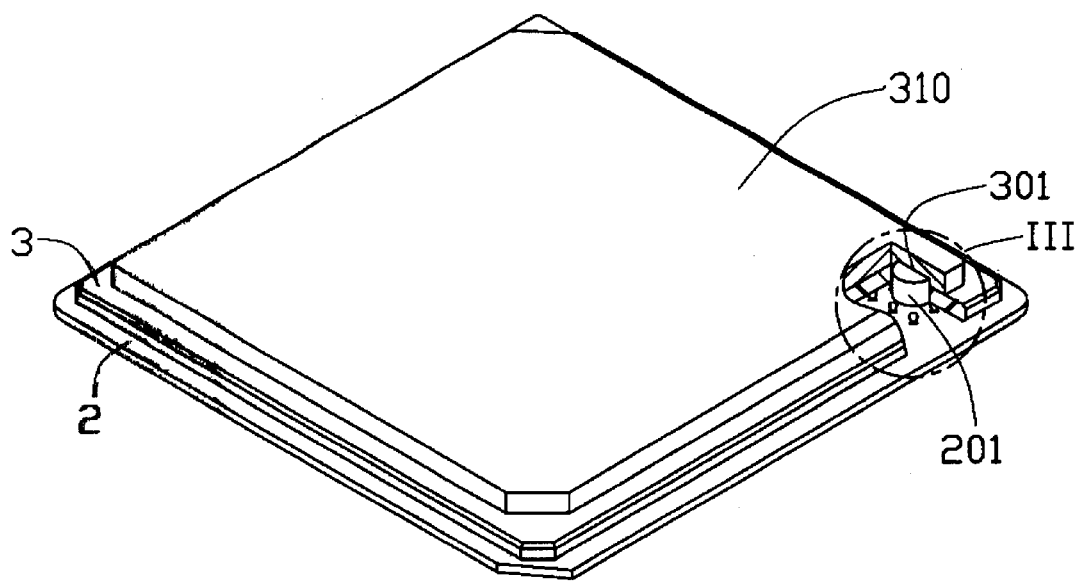
FIG. 2 is an assembled view of FIG. 1, partly cut away.

Referring to FIGS. 1 and 2, an LGA electrical connector 2 in accordance with a preferred embodiment of the present invention is for engaging with an LGA chip 3. The LGA connector 2 comprises an insulative housing 20, and a multiplicity of terminals 21 received in the housing 20.

The housing 20 is substantially square or rectangular. The housing 20 defines a multiplicity of terminal passageways 200 therein, for receiving the terminals 21. A cylindrical first post 201 and a cylindrical second post 202 extend upwardly from two diagonally opposite corners of the housing 20 respectively. A diameter of the first post 201 is less than that of the second post 202.

The LGA chip 3 comprises a top surface 31, and a bottom surface 30 opposite to the top surface 31. A multiplicity of contact pads 300 is formed on the bottom surface 30, corresponding to the terminal passageways 200 of the housing 20. A first recess 301 and a second recess 302 are defined in diagonally opposite corners of the bottom surface 30 respectively, corresponding to the first and second posts 201, 202 of the housing 20 respectively. The first and second recesses 301, 302 are blind, and a diameter of the first recess 301 is less than that of the second recess 302. The diameters of the first and second recesses 301, 302 are substantially the same as the respective diameters of the first and second posts 201, 202. A heat sink contact portion 310 (see FIG. 2) extends upwardly from the top surface 31, for supporting a heat sink device (not shown) thereon.

Figure 3:
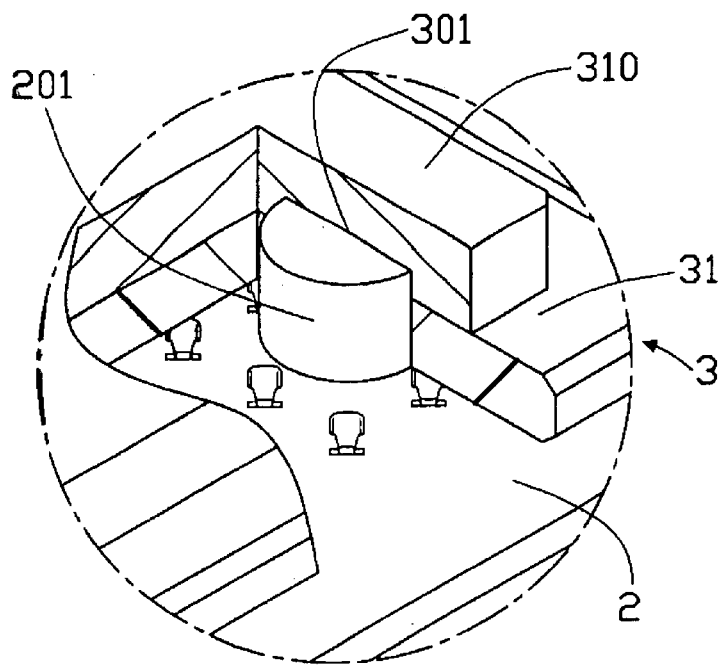
FIG. 3 is an enlarged view of a circled portion III of FIG. 2.

Referring to FIGS. 2 and 3, in assembly of the LGA connector 2 with the LGA chip 3, the LGA chip 3 is inserted into the LGA connector 2 along a direction of assembly. The first and second recesses 301, 302 interferentially receive the first and second posts 201, 202. Thus the LGA chip 3 is securely mounted on the housing 20 of the LGA connector 2.

The contact pads 300 of the LGA chip 3 are engaged with the terminals 21 of the LGA connector 2, thus electrically connecting the LGA chip 3 with the LGA connector 2. The first and second posts 201, 202 of the LGA connector 2 and the first and second recesses 301, 302 of the LGA chip 3 cooperate to precisely position the LGA chip 3 on the LGA connector 2. This ensures that the engagement between the contact pads 300 and the terminals 21 is highly accurate and reliable. In addition, because the first and second posts 201, 202 are differently sized, and the first and second recesses 301, 302 are differently sized, mismating of the LGA chip 3 with the LGA connector 2 is prevented.

Figure 4:
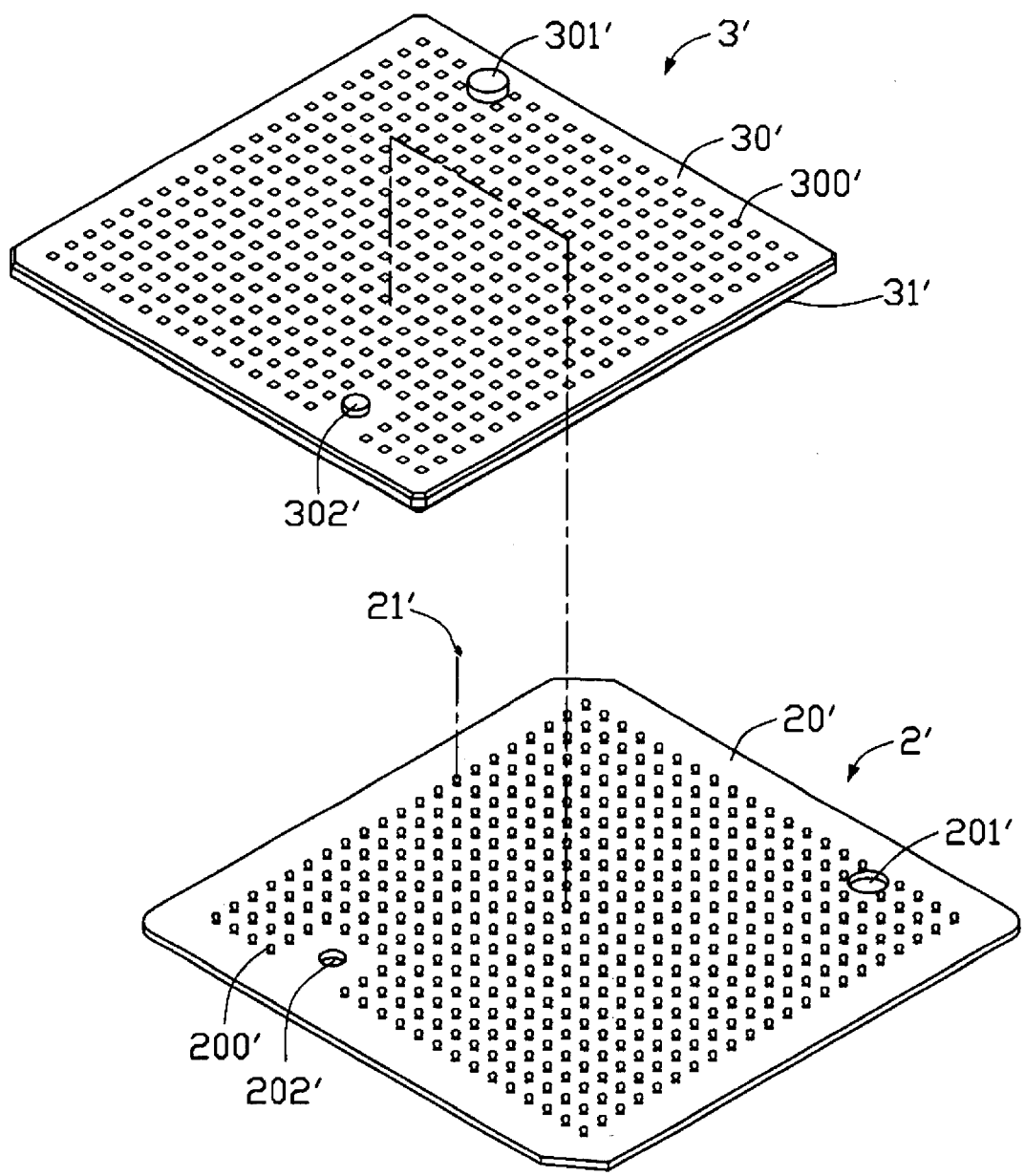
FIG. 4 is a simplified, exploded isometric view of an LGA electrical connector in accordance with an alternative embodiment of the present invention, together with an LGA chip.
Figure 5:
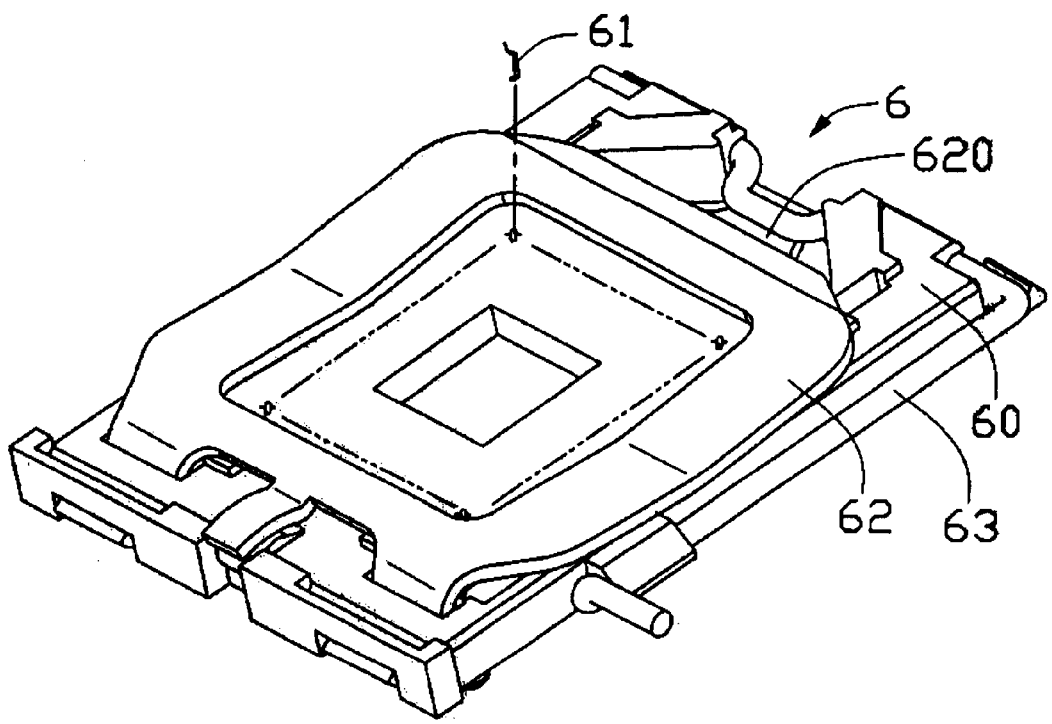
FIG. 5 is an isometric view of a conventional LGA electrical connector.
Figure 6:
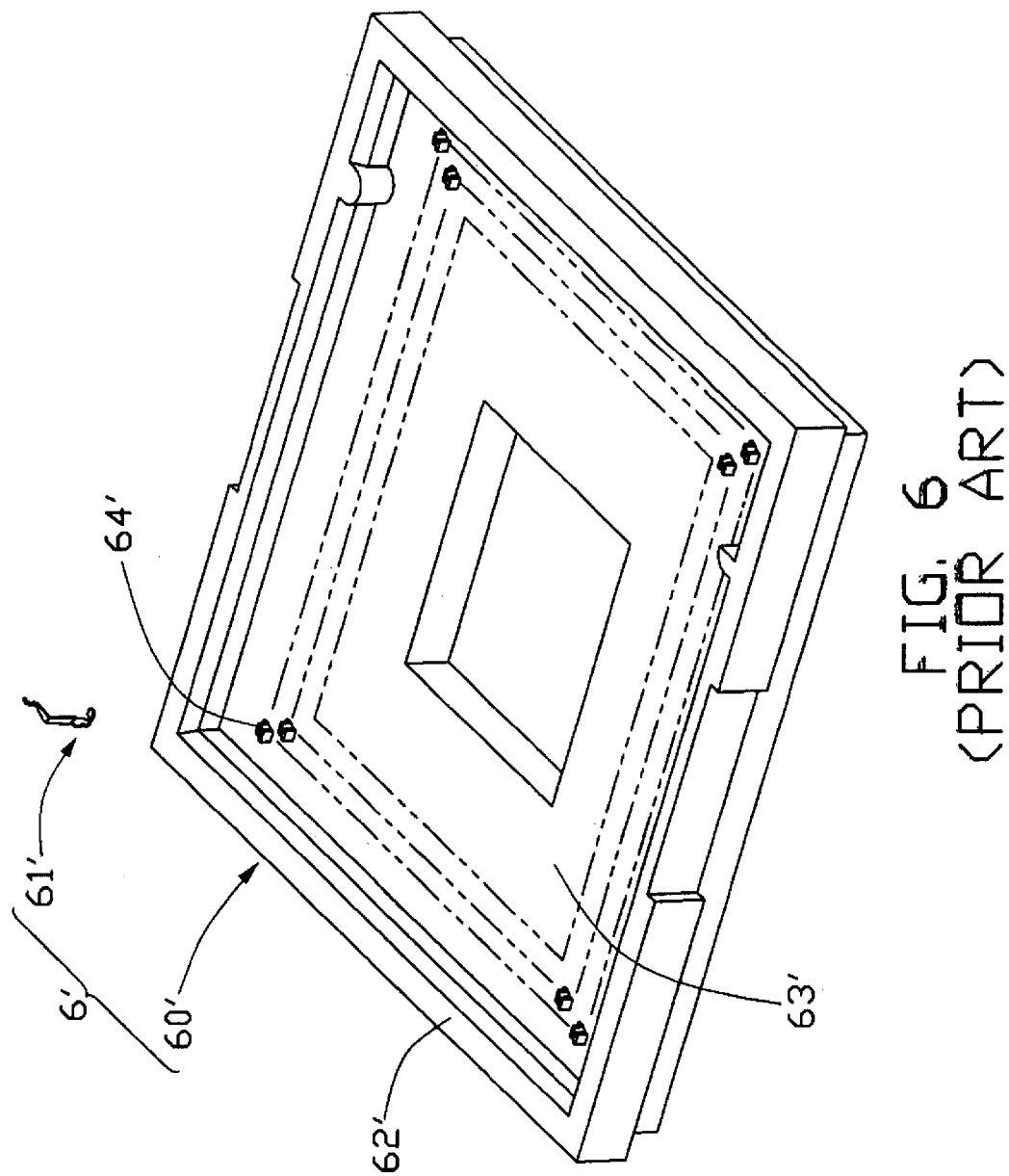
FIG. 6 is a simplified, exploded isometric view of another conventional LGA electrical connector.

Referring to FIG. 4, an LGA connector 2' in accordance with an alternative embodiment of the present invention has a structure similar to that of the connector 2 of the preferred embodiment. The connector 2' comprises a housing 20' defining a multiplicity of passageways 200' therethrough, the passageways 200' receiving a multiplicity of terminals 21'. A cylindrical first recess 201' and a cylindrical second recess 202' are defined in diagonally opposite portions of the housing 20' respectively. A diameter of the first recess 201' is greater than that of the second recess 202', and a depth of the first recess 201' is greater than that of the second recess 202'. The LGA chip 3' comprises a top surface 31', and a bottom surface 30' opposite to the top surface 31'. A multiplicity of contact pads 300' is formed on the bottom surface 30', corresponding to the passageways 200' of the housing 20'. A first post 301' and a second post 302' extend from the bottom surface 30', corresponding to the first and second recesses 201', 202' respectively. A height of the first post 301 is greater than that of the second post 302'. The first and second recesses 201', 202' respectively interferingly receive the first and second posts 301', 302'. Thus the LGA chip 3' is securely mounted on the housing 20' of the LGA connector 2'.

While preferred embodiments in accordance with the present invention have been shown and described, equivalent modifications and changes known to persons skilled in the art according to the spirit of the present invention are considered within the scope of the present invention as defined in the appended claims.

What is claimed is:

1. An electrical connector assembly connecting an electronic package with a circuit substrate, the electrical connector assembly comprising:

an insulative housing defining a plurality of passageways therethrough;

a plurality of terminals received in corresponding passageways of the housing, respectively; and wherein the electronic package having a top surface and a bottom surface opposite to the top surface, the bottom surface defines a plurality of contact pads thereon corresponding to the terminals, and the insulative housing comprises a plurality of complementary posts or recesses and the electronic package comprises a plurality of complementary posts or recesses;

wherein the plurality of posts extend upwardly from two diagonally opposite corners of the housing or two diagonally opposite corners of the electronic package respectively;

wherein a height of each of the posts is different from that of the other post;

wherein the plurality of recesses defined in diagonally opposite corners of the bottom surface of the electronic package or diagonally opposite corners of the housing, corresponding to the posts respectively, and each of the recesses is blind;

wherein a depth of each of the recesses is different from that of the other recess; and when the electronic package is mounted on the housing, the recesses interferentially engagingly receive the posts for ensuring reliable positioning between the electronic package and the insulative housing and correct aligning of the electronic package relative to the insulative housing.

2. The electrical connector assembly as claimed in claim 1, wherein a heat sink portion extends upwardly from the top surface of the electronic package.

3. An electrical connector connecting an electronic package with a circuit substrate, the electrical connector comprising:

an insulative housing defining a plurality of terminal passageways;

a plurality of terminals received in corresponding passageways of the housing, respectively;

wherein the insulating housing define a plurality of complementary posts or recesses having different cross sectional areas and the electronic package define a plurality of complementary posts or recesses having different cross sectional areas;

wherein the plurality of posts extending upwardly from two diagonally opposite corners of the housing or two diagonally opposite corners of the electronic package respectively;

wherein a height of each of the posts is different from a height of the other post;

wherein the plurality of recesses are defined in the electronic package or at two diagonally opposite corner portions of the housing corresponding to the posts, and the two recesses are blind;

wherein a depth of each of the recesses is different from a depth of the other recess.

4. An electrical connector assembly comprising:

a rectangular insulative housing defining a plurality of passageways in a matrix type;

a plurality of terminals disposed in the corresponding passageways, respectively, with tips extending above an upper face of the housing;

a LGA (Land Grid Array) chip positioned upon the upper face of the housing to impose downward forces upon the upwardly exposed tips of the terminals to downwardly deflect the corresponding terminals for electrical connection therebetween, said LGA chip defining thereon a bottom face closely confronting the upper face of the housing;

a pair of posts extending from two diagonally opposite corners of one of said upper face of the housing and two diagonally opposite corners of said bottom face of the LGA chip toward the other; and a pair of holes recessed from the other of said upper face of the housing and said bottom face of the LGA chip away from said one; wherein alignment between said LGA chip and said housing is derived from interengagement between the pair of posts and the pair of holes only, without involvement of any confinement imposed upon a periphery of said LGA chip.

\* \* \* \* \*